(12) United States Patent
Lee

(10) Patent No.: US 7,229,870 B2
(45) Date of Patent: Jun. 12, 2007

(54) METHODS OF FABRICATING SEMICONDUCTOR DEVICES

(75) Inventor: Byeong Ryeol Lee, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/027,513

(22) Filed: Dec. 29, 2004

(65) Prior Publication Data

US 2005/0158941 A1    Jul. 21, 2005

(30) Foreign Application Priority Data

Dec. 30, 2003    (KR) .................. 10-2003-0100534

(51) Int. Cl.
*H01L 21/8238* (2006.01)
(52) U.S. Cl. .................. 438/199; 438/223; 438/230; 438/231; 438/232
(58) Field of Classification Search ................ 438/199, 438/223, 230–232
See application file for complete search history.

(56) References Cited

U.S. PATENT DOCUMENTS

| | | | | |
|---|---|---|---|---|
| 5,753,556 A | * | 5/1998 | Katada et al. ............... | 438/302 |
| 6,333,249 B2 | * | 12/2001 | Kim et al. ................... | 438/592 |
| 6,624,014 B2 | * | 9/2003 | Hsien ......................... | 438/199 |
| 2004/0023478 A1 | * | 2/2004 | Samavedam et al. ....... | 438/592 |
| 2005/0026342 A1 | * | 2/2005 | Fung et al. ................. | 438/197 |
| 2006/0068541 A1 | * | 3/2006 | Chidambaram et al. .... | 438/203 |

* cited by examiner

*Primary Examiner*—Hsien-Ming Lee
(74) *Attorney, Agent, or Firm*—Andrew D. Fortney

(57) ABSTRACT

Methods of fabricating CMOS transistors are disclosed. A disclosed method includes forming first and second gate patterns on the first and second wells, respectively; forming a sidewall insulating layer over the substrate; forming first lightly doped regions in the first well by NMOS LDD ion implantation; forming a first gate spacer insulating layer over the substrate; forming second lightly doped regions in the second well by PMOS LDD ion implantation; sequentially stacking a spacer insulating layer and a second gate spacer insulating layer on the first gate spacer insulating layer; forming first and second spacers on sidewalls of the first and second gate patterns; and forming first and second heavily doped regions in the first and second wells by NMOS and PMOS source/drain ion implantations, respectively.

20 Claims, 8 Drawing Sheets

Impurity movement direction

METHODS OF FABRICATING SEMICONDUCTOR DEVICES

FIELD OF THE DISCLOSURE

The present disclosure relates generally to methods of fabricating semiconductor devices, and more particularly, to methods of fabricating CMOS transistors, in which LDD dopants are implanted at high energy after forming a first gate spacer oxide layer to overcome an equipment limit present when low energy implantation is employed.

BACKGROUND

Generally, a pitch of a semiconductor device is shortened in accordance with a decreasing design rule, such that a channel length of a transistor is considerably reduced. To accommodate a decrease in the gate length below 0.13 μm, many efforts are being made to research and develop a shallow junction and super steep channel doping. Low energy implantation is currently performed for shallow junctions, which lowers the throughput of the manufacturing process.

FIG. 1 is a cross-sectional illustration of a prior art CMOS transistor. Referring to FIG. 1, the junction of a deep, sub-micron transistor is formed in the following manner. First, after a gate pattern has been formed, a sidewall oxide layer is deposited to have a thickness of about 20 Å thick.

LDD ion implantation is then performed at a low energy of about 2~5 KeV to form the shallow junction of a PMOS transistor. Since the ion implantation energy is low, the dopant profile throughput of the equipment is lowered, which reduces the process margin.

Moreover, since the junction is made shallow to suppress lateral diffusion, junction loss in salicidation is increased, which, in turn, increases the drain leakage current of the transistor. Additionally, the transistor process margin is lowered by the short channel effect which is attributable to lateral diffusion of the impurities.

In the case of a PMOS transistor, a halo structure having a higher impurity density than the well is provided in the vicinity of the source/drain to prevent the depletion areas of the source and drain from closely approaching each other in a horizontal direction. As a result, the depletion areas of the source/drain are shortened and the performance of the PMOS transistor is lowered.

BRIEF DESCRIPTION OF THE DRAWINGS

Wherever possible, the same reference numbers will be used throughout the drawings to refer to the same or like parts.

DETAILED DESCRIPTION

Figure 1:
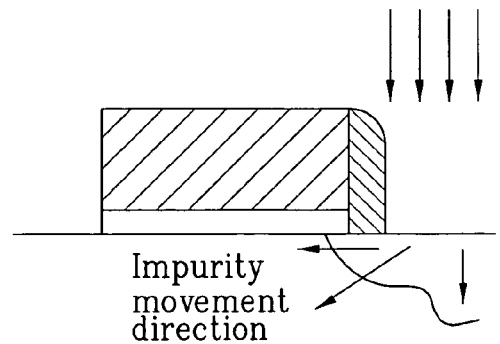
FIG. 1 is a cross-sectional illustration of a prior art CMOS transistor.
Figure 2:
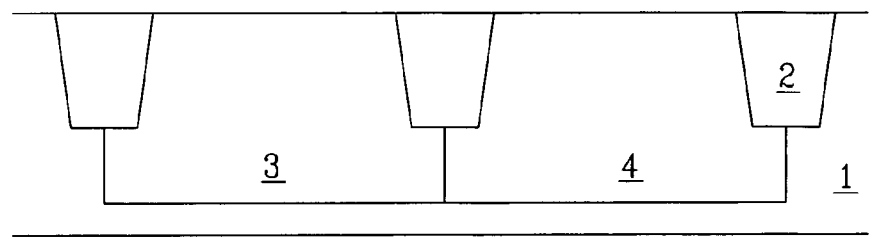
FIGS. 2 to 9 are cross-sectional illustrations of an example method of fabricating CMOS transistors performed in accordance with the teachings of the present invention.

FIGS. 2 to 9 are cross-sectional illustrations of an example method of fabricating CMOS transistors performed in accordance with the teachings of the present invention. Referring to FIG. 2, device isolation layers 2 are formed in a first conductive type semiconductor substrate 1 to define active areas. In the illustrated example, the semiconductor substrate is a silicon substrate 1.

Impurities of a second conductive type are then implanted into the substrate 1 to form wells 3 and 4.

Figure 3:
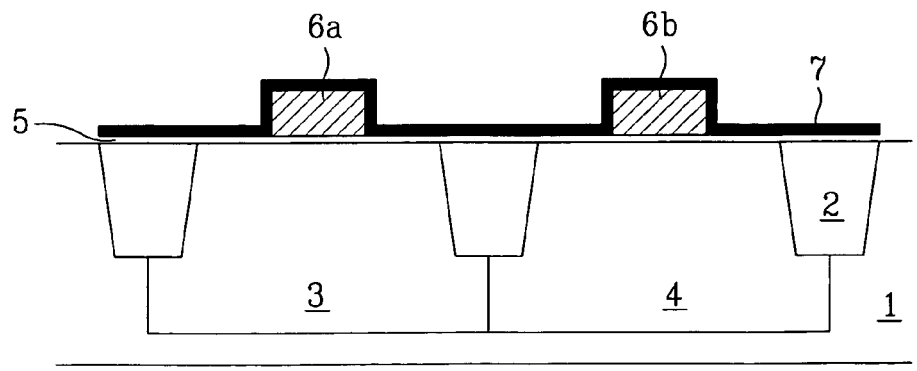

Referring to FIG. 3, a gate oxide layer 5 is formed on the substrate 1 including the wells 3 and 4.

A polysilicon layer is then deposited on the gate oxide layer 5. The polysilicon layer is then patterned by photolithography to form gate electrodes 6a and 6b. The gate electrodes 6a, 6b are located over the wells 3 and 4, respectively.

Subsequently, a sidewall oxide layer 7 is formed over the substrate 1 including over the gate electrodes 6a and 6b to compensate for gate electrode damage. In the illustrated example, the sidewall oxide layer 7 has a thickness of about 20~50 Å.

Figure 4:
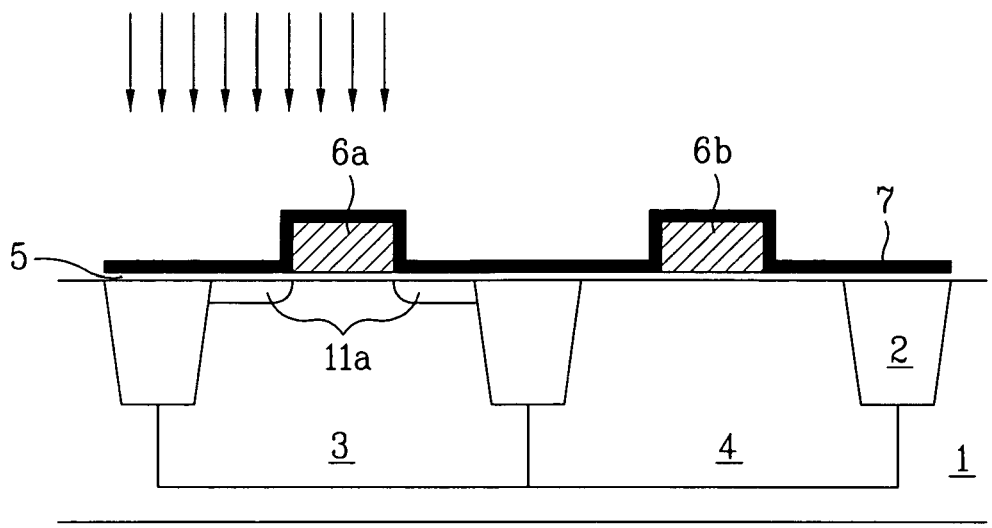

Referring to FIG. 4, NMOS LDD ion implantation is performed on the well 3 to form LDD regions 11a for an NMOS transistor. The LDD regions 11a are aligned with the gate electrode 6a of the NMOS transistor.

Figure 5:
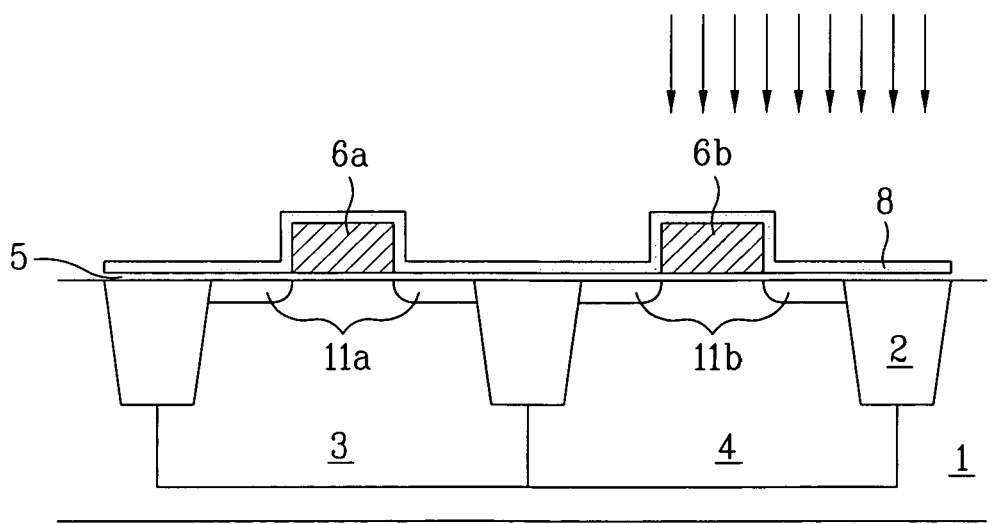

Referring to FIG. 5, a first gate spacer oxide layer 8 for forming gate spacers is formed on the sidewall oxide layer 7 (not shown). In the illustrated example, the first gate spacer oxide layer 8 has a thickness of about 100~300 Å.

PMOS LDD ion implantation is then performed on the well 4 to form LDD regions 11b of a PMOS transistor. The LDD regions 11b are aligned with the gate electrode 6b of the PMOS transistor. In the illustrated example, $BF_1$ and/or $BF_2$ ions are used as the dopant for the PMOS LDD ion implantation. Further, in the illustrated example, the PMOS LDD ion implantation is performed at high energy of about 10~50 KeV to implant the dopant into the well 4 of the substrate 1. As a result, the short channel effect is overcome by forming a deep junction profile and by suppressing lateral diffusion of the dopants.

Figure 6:
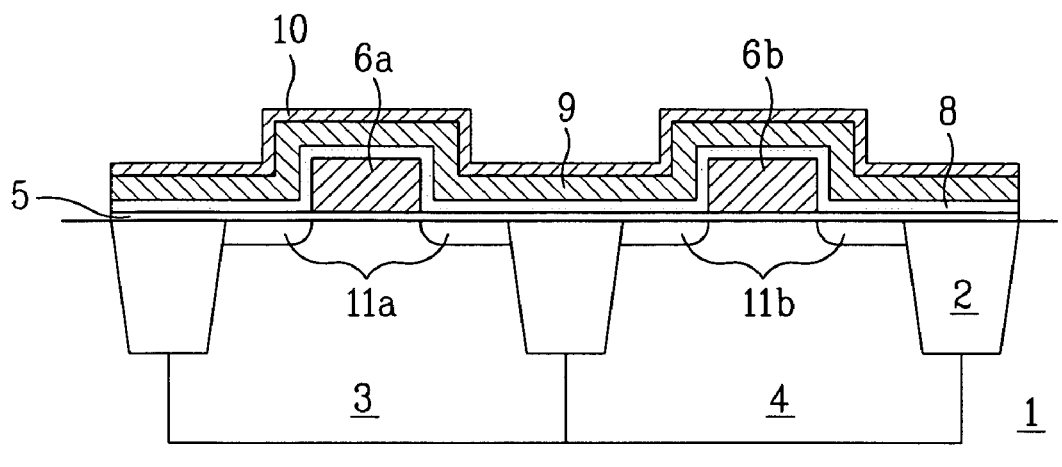

Referring to FIG. 6, a spacer nitride layer 9 is deposited on the first gate spacer oxide layer 8. In the illustrated example, the spacer nitride layer 9 has a thickness of about 500~700 Å.

A second gate spacer oxide layer 10 is deposited on the spacer nitride layer 9. In the illustrated example, the second gate spacer oxide layer 10 has a thickness of about 100~300 Å.

Figure 7:
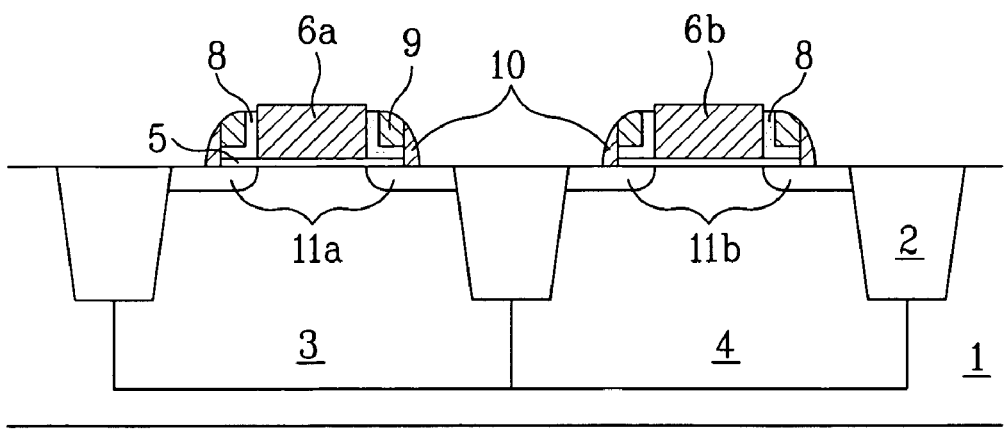

Referring to FIG. 7, anisotropic etching is performed on the structure of FIG. 6 until a surface of the substrate 1 including the LDD regions 11a, 11b is exposed to form the sidewall spacers of the gate electrodes 6a, 6b, respectively.

Figure 8:
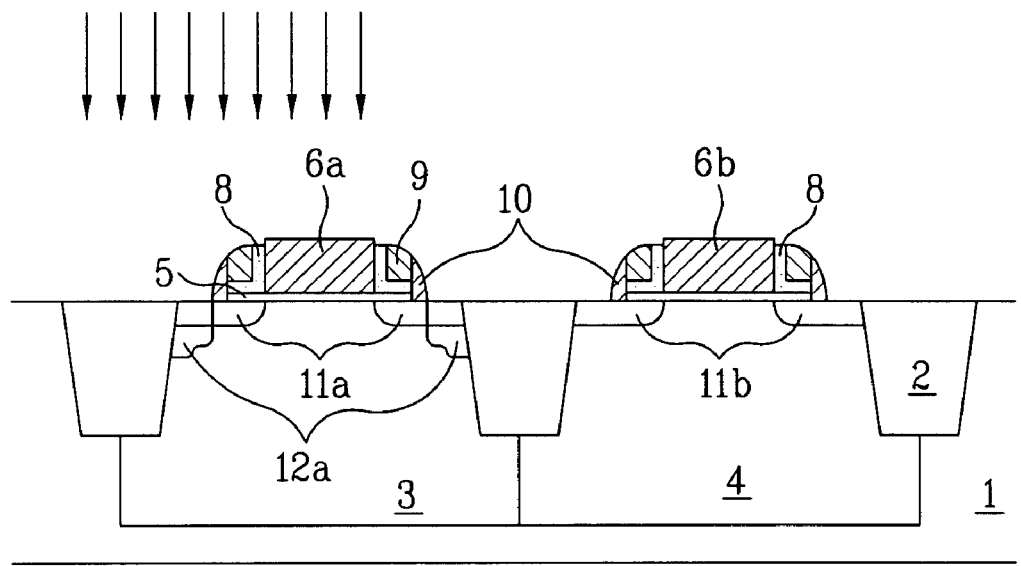

Referring to FIG. 8, NMOS source/drain ion implantation is performed on the well 3 to form heavily doped NMOS source/drain regions 12a in the well 3 of the substrate 1. The heavily doped NMOS source/drain regions 12a are aligned with respective ones of the sidewall spacers of the gate electrode 6a of the NMOS transistor.

Figure 9:
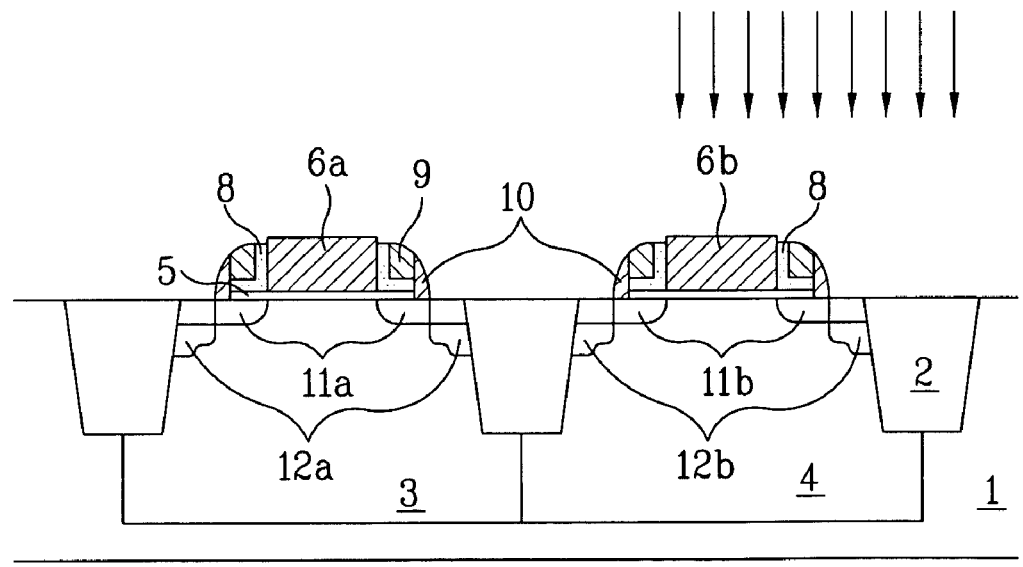

Referring to FIG. 9, PMOS source/drain ion implantation is performed on the well 4 to form heavily doped PMOS source/drain regions 12b in the well 4 of the substrate 1. The heavily doped PMOS source/drain regions 12b are aligned with respective ones of the sidewall spacers of the gate electrode 6b of the PMOS transistor.

Figure 10:
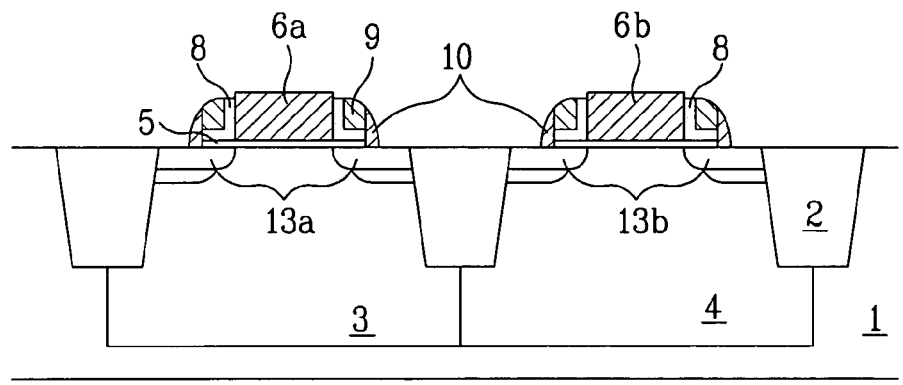
FIG. 10 is a cross-sectional illustration of example CMOS transistors constructed in accordance with the teachings of the present invention.

FIG. 10 is a cross-sectional illustration of example CMOS transistors constructed in accordance with the teachings of the present invention. Referring to FIG. 10, the dopants in the LDD regions 11a, 11b and the source/drain regions 12a, 12b are activated by annealing to form a source and a drain 13a of the NMOS transistor and a source and a drain 13b of the PMOS transistor. The example CMOS transistors of FIG. 10 are then completed.

Figure 11:
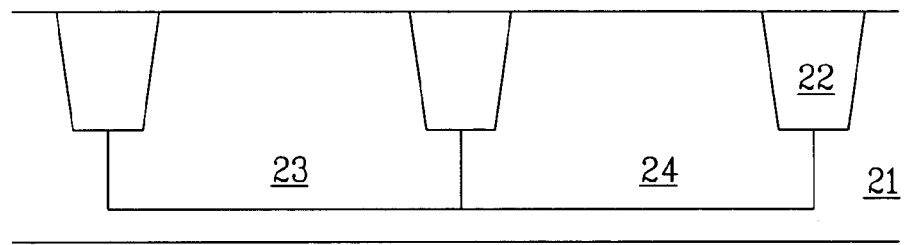
FIGS. 11 to 17 are cross-sectional illustrations of another example method of fabricating CMOS transistors performed in accordance with the teachings of the present invention.

FIGS. 11 to 17 are cross-sectional illustrations of another example method of fabricating CMOS transistors performed in accordance with the teachings of the present invention. Referring to FIG. 11, device isolation layers 22 are formed in a first conductive type semiconductor substrate 21 to define active areas. In the illustrated example, the semiconductor substrate is a silicon substrate 21.

Impurities of a second conductive type are implanted into the substrate 1 to form wells 23 and 24.

Figure 12:
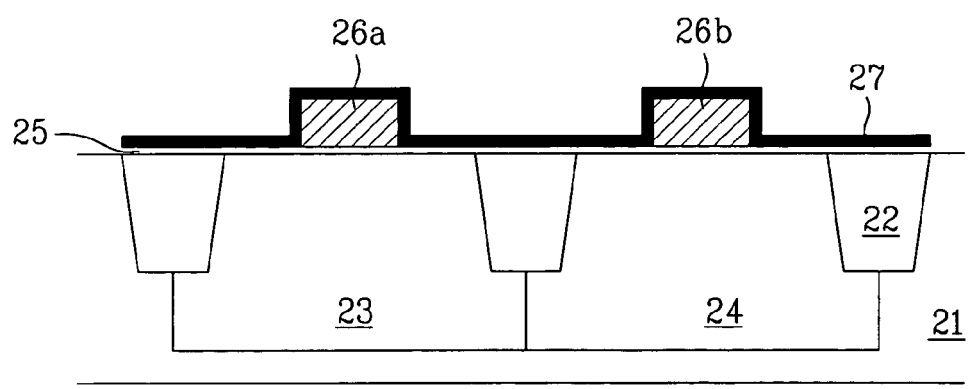

Referring to FIG. 12, a gate oxide layer 25 is formed on the substrate 21 including the wells 23, 24.

A polysilicon layer is deposited on the gate oxide layer 25. The polysilicon layer is then patterned by photolithography to form gate electrodes 26a and 26b over the wells 23 and 24, respectively.

Subsequently, a sidewall oxide layer 27 is formed over the substrate 21 including over the gate electrodes 26a, 26b to compensate for gate electrode damage. In the illustrated example, the sidewall oxide layer 27 has a thickness of about 20~50 Å.

Figure 13:
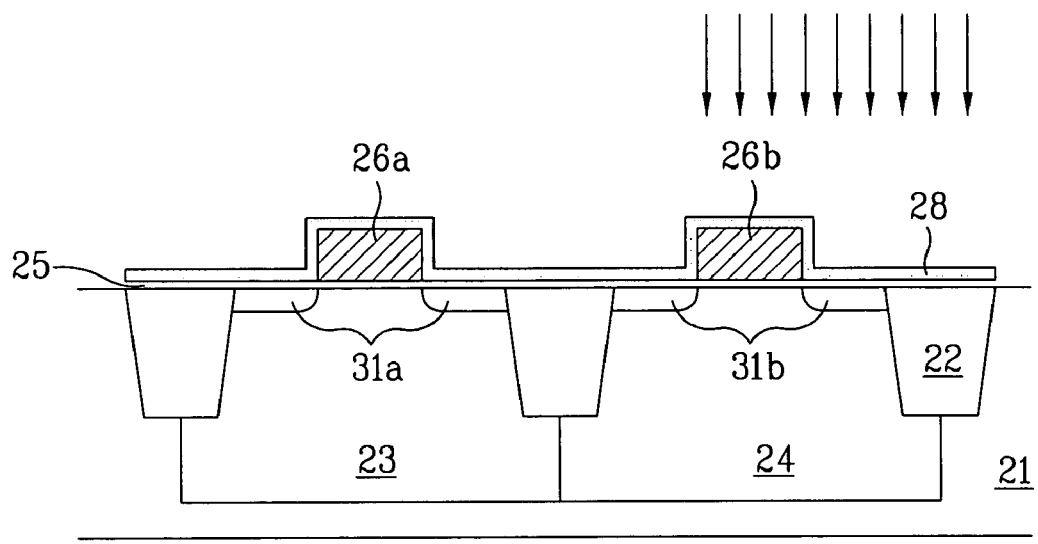

Referring to FIG. 13, a first gate spacer oxide layer 28 for forming gate spacers is formed on the sidewall oxide layer 27 (not shown). In the illustrated example, the first gate space oxide layer 28 has a thickness of about 100~300 Å.

NMOS LDD ion implantation is performed on the well 23 of the substrate 21 to form LDD regions 31a for an NMOS transistor. The LDD regions 31a are aligned with the gate electrode 26a of the NMOS transistor.

Subsequently, PMOS LDD ion implantation is performed on the well 24 of the substrate 21 to form LDD regions 31b for a PMOS transistor. The LDD regions 31b are aligned with the gate electrode 26b of the PMOS transistor. In the illustrated example, $BF_1$ and/or $BF_2$ ions are used as dopants for the PMOS LDD ion implantation. More specifically, in the illustrated example, the PMOS LDD ion implantation is performed at high energy of about 10~50 KeV to implant the dopant into the well 24 of the substrate 21. As a result, the short channel effect is overcome by forming a deep junction profile and by suppressing lateral diffusion of the dopant.

Figure 14:
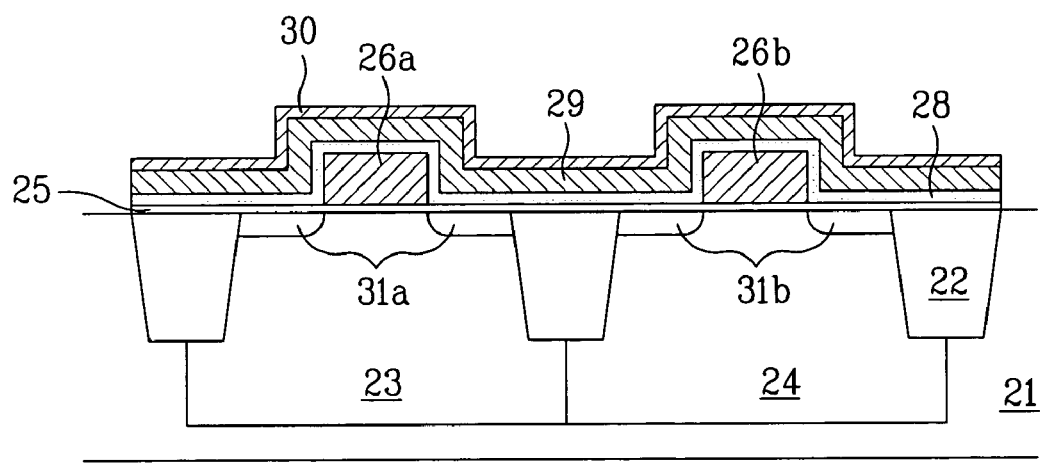

Referring to FIG. 14, a spacer nitride layer 29 is deposited on the first gate spacer oxide layer 28. In the illustrated example, the spacer nitride layer 29 is about 500~700 Å thick.

A second gate spacer oxide layer 30 is deposited on the spacer nitride layer 29. In the illustrated example, the second gate spacer oxide layer 30 is about 100~300 Å thick.

Figure 15:
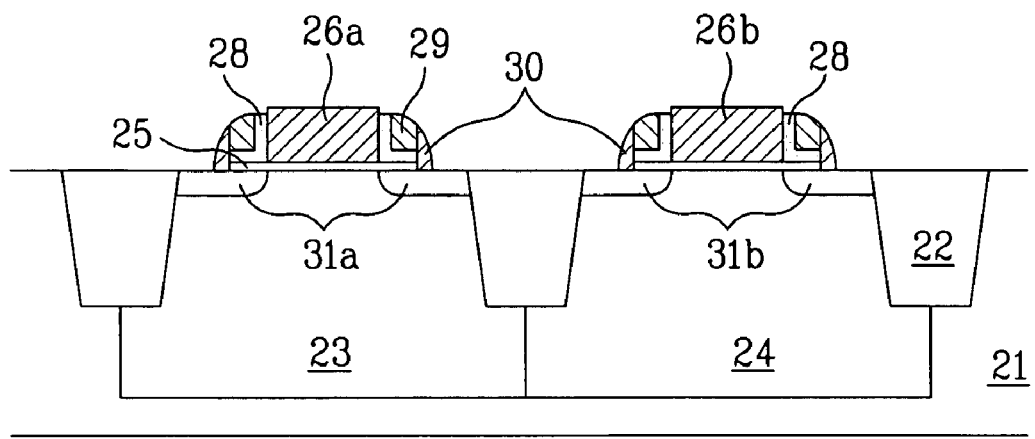

Referring to FIG. 15, anisotropic etching is performed over the substrate 21 until a surface of the substrate 21 including the LDD regions 31a, 31b is exposed to form the sidewall spacers of the gate electrodes 26a and 26b, respectively.

Figure 16:
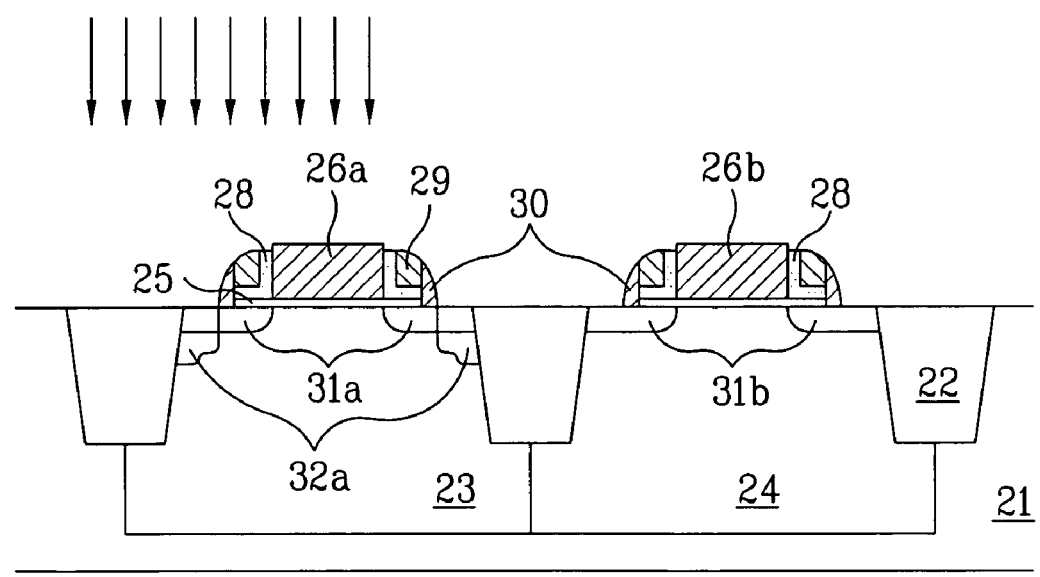

Referring to FIG. 16, NMOS source/drain ion implantation is performed on the well 23 to form heavily doped NMOS source/drain regions 32a in the well 23 of the substrate 21. The source/drain regions 32a are aligned with the sidewall spacers of the gate electrode 26a of the NMOS transistor.

Figure 17:
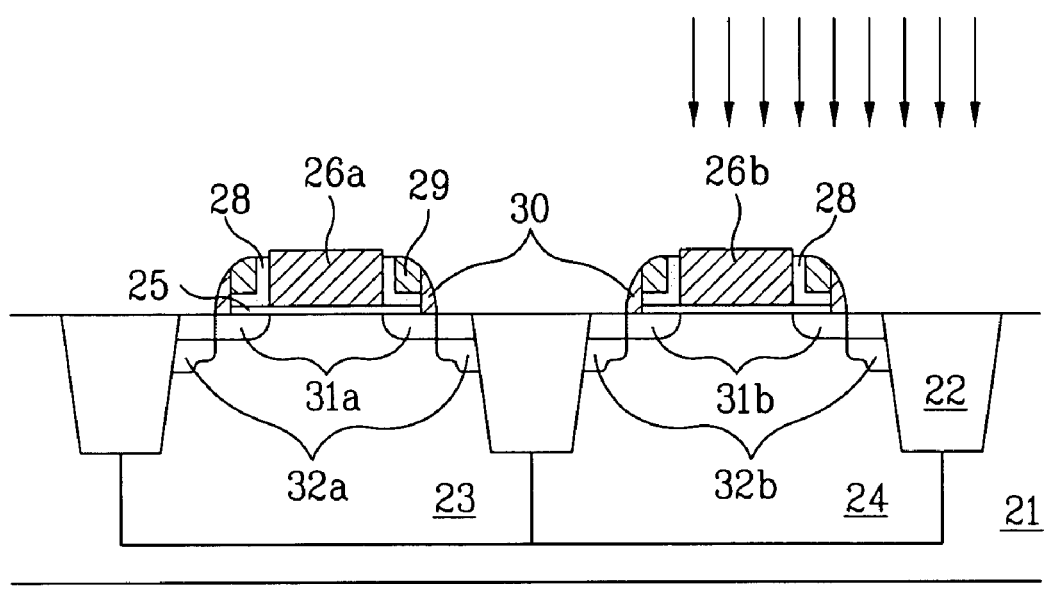

Referring to FIG. 17, PMOS source/drain ion implantation is performed on the well 23 to form heavily doped PMOS source/drain regions 32b in the well 23 of the substrate 21. The source/drain regions 32b are aligned with the sidewall spacers of the gate electrode 26b of the PMOS transistor.

Subsequently, the dopants in the LDD regions 31a, 31b and the source/drain regions 32a, 32b are activated by annealing to form a source and drain of the NMOS transistor and a source and drain of the PMOS transistor.

From the foregoing, persons of ordinary skill in the art will readily appreciate that PMOS LDD dopants are implanted with high energy after forming a first gate spacer oxide layer. As a result, the short channel effect is overcome by forming a deep junction profile and by suppressing lateral diffusion of the dopants. Consequently, a low energy equipment limit is overcome thereby providing a specific junction profile. Accordingly, the throughout of the process is increased, and the performance of the fabricated transistors is raised.

Persons of ordinary skill in the art will appreciate that methods of fabricating CMOS transistors, in which LDD dopants are implanted with high energy after forming a first gate spacer oxide layer are disclosed. The disclosed example methods overcome a low energy equipment limit, and provide a specific junction profile.

A disclosed example method of fabricating CMOS transistors comprises: forming a first well and a second well in active areas of a semiconductor substrate, respectively; forming first and second gate patterns on gate insulating layers above the first and second wells, respectively; forming a sidewall insulating layer over the resulting substrate; forming first lightly doped regions in the first well in alignment with the first gate pattern by NMOS LDD ion implantation; forming a first gate spacer insulating layer over the substrate including the sidewall insulating layer; forming second lightly doped regions in the second well in alignment with the second gate pattern by PMOS LDD ion implantation; sequentially stacking a spacer insulating layer and a second gate spacer insulating layer on the first gate spacer insulating layer; forming first and second spacers on sidewalls of the first and second gate patterns, respectively, by patterning the second and first gate spacer insulating layers and the sidewall insulating layer; and forming first and second heavily doped regions in the first and second wells of the substrate by NMOS and PMOS source/drain ion implantations, the first and second heavily doped regions being aligned with the first and second spacers, respectively.

Preferably, the second lightly and heavily doped regions are doped with $BF_1$ and/or $BF_2$ ions.

Preferably, the PMOS LDD ion implantation is performed at about 10~50 KeV.

A disclosed example method of fabricating CMOS transistors comprises: forming a first well and a second well in active areas of a semiconductor substrate; forming first and second gate patterns on gate insulating layers located on the first and second wells, respectively; forming a sidewall insulating layer over the resulting substrate including over the first and second gate patterns; forming a first gate spacer insulating layer over the sidewall insulating layer; forming first lightly doped regions in the first well in alignment with the first gate pattern by NMOS LDD ion implantation; forming second lightly doped regions in the second well in alignment with the second gate pattern by PMOS LDD ion implantation; sequentially stacking a spacer insulating layer and a second gate spacer insulating layer on the first gate spacer insulating layer, forming first and second spacers on sidewalls of the first and second gate patterns by patterning the second and first gate spacer insulating layers and the sidewall insulating layer; and forming first and second heavily doped regions in the first and second wells by NMOS and PMOS source/drain ion implantations, wherein the first and second heavily dope regions are aligned with the first and second spacers, respectively.

Preferably, the second lightly and heavily doped regions are doped with $BF_1$ and/or $BF_2$ ions.

Preferably, the PMOS LDD ion implantation is performed at about 10~50 KeV.

It is noted that this patent claims priority from Korean Patent Application Serial Number P2003-0100534, which was filed on Dec. 30, 2003, and is hereby incorporated by reference in its entirety.

Although certain example methods, apparatus and articles of manufacture have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A method of fabricating CMOS transistors comprising:
    forming a first well and a second well in active areas of a semiconductor substrate;
    forming first and second gate patterns on gate insulating layers on the first and second wells, respectively;
    forming a sidewall insulating layer;
    performing NMOS LIDD ion implantation to form first lightly doped regions in the first well;
    forming a first gate spacer insulating layer over the sidewall insulating layer;
    performing PMOS LDD ion implantation to form second lightly doped regions in the second well;
    sequentially stacking a spacer insulating layer and a second gate spacer insulating layer on the first gate spacer insulating layer;
    patterning the second and first gate spacer insulating layers and the sidewall insulating layer to form first and second spacers on sidewalls of the first and second gate patterns and expose upper surfaces of the semiconductor substrate in areas of the first and second lightly doped regions;
    performing NMOS source/drain ion implantation to form first heavily doped regions in the first well; and
    performing PMOS source/drain ion implantation to form second heavily doped regions in the second well.

2. A method as defined in claim 1, wherein the second lightly doped regions and the second heavily doped regions we doped with $BF_1$ and/or $BF_2$ ions.

3. A method as defined in claim 1, wherein the PMOS LDD ion implantation is performed at about 10~50 KeV.

4. A method as defined in claim 3, wherein the second lightly doped regions have a deep junction profile.

5. A method as defined in claim 1, further comprising forming device isolation layers in the semiconductor substrate to define the active areas.

6. A method as defined in claim 5, wherein the device isolation layers are formed prior to forming the first and second wells and are disposed between the first and second wells.

7. A method as defined in claim 1, wherein the gate insulating layers comprise an oxide layer.

8. A method as defined in claim 1, wherein forming the first and second gate patterns comprises depositing and patterning a polysilicon layer.

9. A method as defined in claim 1, wherein forming the sidewall insulating layer comprises forming an oxide layer over The semiconductor substrate including the first and second gate patterns.

10. A method as defined in claim 9, wherein the sidewall insulating layer has a thickness of about 20~50 Å.

11. A method as defined in claim 1, wherein the first and second lightly doped regions are aligned with the first and second gate patterns, respectively.

12. A method as defined in claim 1, wherein the spacer insulating layer comprises a nitride layer having a thickness of about 500~700 Å.

13. A method as defined in claim 1, wherein the second gate spacer insulating layer comprises an oxide layer and has a thickness of about 100~300 Å.

14. A method as defined in claim 1, wherein patterning the second and first gate spacer insulating layers and the sidewall insulating layer to form first and second spacers comprises anisotropically etching the second and first gate spacer insulating layers and the sidewall insulating layer.

15. A method as defined in claim 1, wherein the first and second heavily doped regions are aligned with the first and second spacers, respectively.

16. A method as defined in claim 1, further comprising annealing the semiconductor substrate after forming the second heavily doped regions.

17. A method of fabricating CMOS transistors comprising:
    forming a first well and a second well in active areas of a semiconductor substrate;
    forming first and second gate patterns on gate insulating layers on the first and second wells, respectively;
    forming a sidewall insulating layer over the first and second gate patterns;
    forming a first gate spacer insulating layer over the sidewall insulating layer;
    performing NMOS LDD ion implantation to form first lightly doped regions in the first well alter forming the first gate spacer insulating layer;
    performing PMOS LDD ion implantation to form second lightly doped regions in the second well;
    sequentially stacking a spacer insulating layer and a second gate spacer insulating layer on the first gate spacer insulating layer;
    patterning the first and second gate spacer insulating layers and the sidewall insulating layer to form first and second spacers on sidewalls of the first and second gate patterns, respectively, and expose upper surfaces of the semiconductor substrate in areas of the first and second lightly doped regions; and
    performing NMOS source/drain ion implantation to form first heavily doped regions in the first well of the substrate; and
    performing PMOS source/drain ion implantation to form second heavily doped regions in the second well of the substrate.

18. A method as defined in claim 17, wherein the second lightly doped regions and the second heavily doped regions are doped with $BF_1$ and/or $BF_2$ ions.

19. A method as defined in claim 17, wherein the PMOS LDD ion implantation is performed at about 10~50 KeV.

20. A method of fabricating CMOS transistors comprising:
    forming a first well and a second well in active areas of a semiconductor substrate;
    forming first and second gate patterns on gate insulating layers on the first and second wells, respectively;

forming a sidewall insulating layer;
performing NMOS LDD ion implantation to form first lightly doped regions in the first well;
forming a first gate spacer insulating layer over the sidewall insulating layer;
performing PMOS LDD ion implantation to form second lightly doped regions in the second well;
sequentially stacking a spacer insulating layer and a second gate spacer insulating layer comprising an oxide layer having a thickness of about 100~300 Å on the first gate spacer insulating layer;
patterning the second and first gate spacer insulating layers and the sidewall insulating layer to form first and second spacers on sidewalls of the first and second gate patterns;
performing NMOS source/drain ion implantation to form first heavily doped regions in the first well; and
performing PMOS source/drain ion implantation to form second heavily doped regions in the second well.

* * * * *